United States Patent [19]

Goto et al.

[11] Patent Number: 4,567,383

[45] Date of Patent: Jan. 28, 1986

[54] FLUXOID TYPE SUPERCONDUCTING LOGIC ELEMENT

[75] Inventors: Eiichi Goto; Hiroshi Ohta, both of Wako, Japan

[73] Assignee: Rikagaku Kenkyusho, Saitama, Japan

[21] Appl. No.: 571,464

[22] Filed: Jan. 17, 1984

[30] Foreign Application Priority Data

Jan. 20, 1983 [JP] Japan ..................... 58-7975

[51] Int. Cl.$^4$ .................. H03K 3/38; H03K 19/195
[52] U.S. Cl. ..................... 307/415; 307/306
[58] Field of Search ............. 307/306, 404, 406, 407, 307/409, 410, 414, 415

[56] References Cited

U.S. PATENT DOCUMENTS

| | | | |
|---|---|---|---|
| 3,863,078 | 1/1975 | Zappe | 307/306 X |
| 3,983,546 | 9/1976 | Zappe | 307/238 |
| 4,176,290 | 11/1979 | Ishida et al. | 307/306 |
| 4,348,710 | 9/1982 | Woods | 307/306 X |
| 4,392,148 | 7/1983 | Chang et al. | 307/306 X |
| 4,482,821 | 11/1984 | Houkawa et al. | 307/306 X |

OTHER PUBLICATIONS

Dynamics of Some Single Flux Quantum Devices: I. Parametric Quantron by Likharev, IEEE Trans. on Magnetics, vol. MAG-13, No. 3, 1–1977.

Dynamics of Some Single Flux Quantum Devices: II. Inhomogeneous Flux Shuttle by Likharev, IEEE Trans. of Magnetics, vol. MAG-13, No. 1, 1–1977.

*Primary Examiner*—A. D. Pellinen
*Assistant Examiner*—Derek S. Jennings
*Attorney, Agent, or Firm*—Brumbaugh, Graves, Donohue & Raymond

[57] ABSTRACT

A fluxoid type superconducting logic element essentially comprises a single main superconductor loop and a switching element connected across the main superconductor loop. When the switching element is open, a permanent current flows in the main superconductor loop of the logic element at a cryogenic temperature, thereby sustaining a half-odd integer multiple of magnetic flux unit in each half of said main loop. When a small amount of input magnetic flux is applied to one half of the main loop and the switch is closed, the distribution of the magnetic flux varies according to the quantum theory to allow an integer multiple of magnetic flux to occupy each separated domain of the main loop. These two different magnetic flux distributions can be used to represent a binary state.

15 Claims, 51 Drawing Figures

FIG. 1A $\Phi 1 + \Phi 0 = N \Phi o$ $\Phi 1 = (n + \frac{1}{2} + k) \Phi o$ $\Phi 0 = (m - \frac{1}{2} - k) \Phi o$ $m + n = N$

FIG. 1B

| $k > 0$ | $k < 0$ |
|---|---|
| $\Phi 1 + \Phi 0 = N\Phi o$ | $\Phi 1 + \Phi 0 = N\Phi o$ |
| $\Phi 1 = (n+1)\Phi o$ | $\Phi 1 = n\Phi o$ |
| $\Phi 0 = (m-1)\Phi o$ | $\Phi 0 = m\Phi o$ |

$f = maj(x, y, \bar{z})$

FIG.11

$M = kL$ $f = maj(x, y, z)$

FIG. 12

$f = maj(x, y, z)$

FIG. 14

$M = kL/2 \quad f = maj(x, y, \bar{z})$

$f = maj(x, y, z)$

FLUXOID TYPE SUPERCONDUCTING LOGIC ELEMENT

The present invention relates to a superconducting logic element and network of elements, and particularly to a superconducting logic element which is capable of performing, according to the quantum theory, various functions as required for instance in an electronic computer. Such logic element is hereinafter referred to as "fluxoid type superconducting logic element". The term, "fluxoid" is an abbreviation for "magnetic flux quantum unit", $\phi_o (=2 \times 10^{-7}$ gauss $cm^{-2})$.

The novel fluxoid type superconducting logic element of the present invention comprises a main loop and a switching element which opens and closes a circuit which extends across the main loop so that when the switch is closed, it converts the main loop into a pair of subloops.

When the switching element is open, a current flow in the main loop sustains a magnetic flux in each half of the main loop. When a small amount of input magnetic flux is applied to half of the main loop and the switch is closed, the distribution of the magnetic flux varies to significantly change the flux in each of the subloops. Thus, the two different magnetic flux distributions can be used to represent a binary state.

For a more complete understanding of the present invention, reference can be made to the detailed description which follows and to the accompanying drawings in which:

FIGS. 6A, 6B, 7, 8A, 8B, 8C and 9 show different types of switches for use in the present invention.

As an example a "Quantron" using a closed superconducting circuit with a Josephson junction included therein can be cited. Only for the sake of convenience, however, a fluxoid type superconducting logic element according to this invention is described in comparison with a "Quantron" at the end of the specification, and first, the principle of the present invention is described in the following.

Figure 1A:
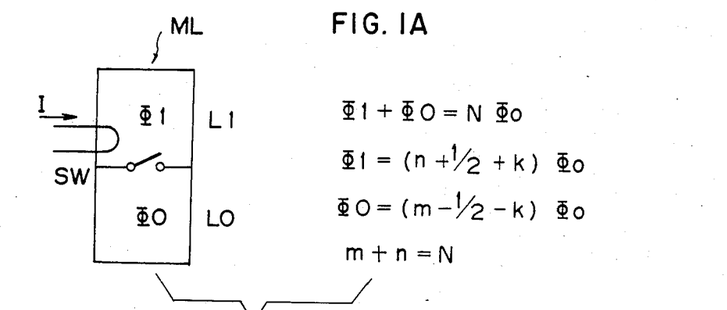
FIGS. 1A and 1B are schematic circuits of the fluxoid type superconductor logic element or "bisectron" of the present invention showing the switching elements open and closed.
Figure 1B:
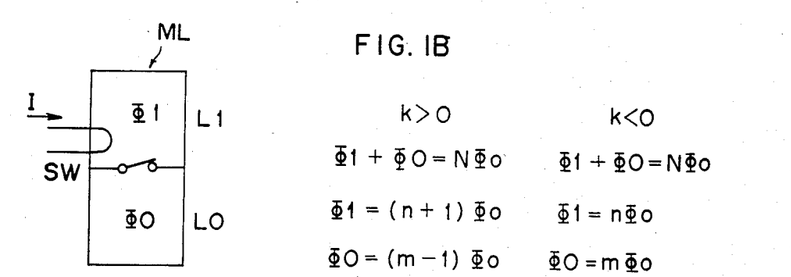

FIG. 1 shows schematically the structure of a fluxoid type superconducting logic element according to this invention. It is shown as comprising a single superconductor loop ML (hereinafter referred to as "Main Loop"); a switching element connected thereacross so as to divide the "Main Loop" into two halves (these halves constituting two corresponding subloops L1 and L0 when the switching element is closed); and a bias winding associated with one of the two halves for establishing a magnetic field which is strong enough to impose one quantum unit (or more quantum units) in a preselected half domain (or distribute in the half domains at a preselected ratio) at the time of closing the switch.

Assume that: when the switch SW is open, a magnetic flux N times as much as the flux quantum unit $\phi_o$ is confined in the main loop, and then a half odd-integer multiple of the flux quantum unit appears in each half domain ($\phi 1 = (n + \frac{1}{2})\phi_0$ and $\phi 0 = (m - \frac{1}{2})\phi_o$ where $m + n = N$). The magnetic flux N times as much as the flux quantum unit $\phi_o$ is established by a permanent electric current $I_p$ which is kept flowing in the main loop so long as the superconducting condition is held.

The switching element SW is closed (FIG. 1B), and then a half-odd integer multiple of magnetic flux $\phi_o$ in each domain increases or decreases to an integer multiple according to the quantum mechanics. (In case that a single flux quantum unit $\phi_o$ is confined in the main loop, it is shifted into one of the two subloops at the time of closing the switching element). The integer to which the half-odd integer multiple increases or decreases at the time of closing the switch is determined by the sign of small amount of a control flux $K\phi_o$. Specifically, for $K>0$, $\phi 1$ increases to $(n+1)\phi_o$, and $\phi 0$ decreases to $(m-1)\phi_o$ whereas for $K<0$, $\phi 1$ decreases to $n\phi_o$ and $\phi 0$ increases to $m\phi_o$. Each of these two different states can be used to represent a single bit binary variable, as, for instance, the former state may represent a binary zero whereas the latter state may represent a binary one. (In case that a single flux quantum unit $\phi_o$ is confined in the main loop, the state in which the flux quantum unit is in the upper subloop L1 (no flux left in the lower subloop L0) may be used to represent a binary zero whereas the state in which the flux quantum unit is in the lower subloop L0 (no flux left in the upper subloop) may be used to represent a binary one.

This bistable element is responsive to a small amount of control flux $K\phi_o$ for adding or subtracting a large flux $\phi_o/2$ in each subloop, thus performing an amplification of magnetic flux by as much as $1/(2K)$ in each domain.

A fluxoid type superconducting logic element according to this invention may be called a "Bisectron" from the form in which a switching element is so positioned across a superconducting loop that closing of the switching element appears to separate one flux quantum unit (for m=1 and n=0) into two exact halves allotting one half of the flux quantum unit to each subloop, although this separation is impossible, indeed.

The number N can be an arbitrary integer. From the angle of stability, however, N is preferably equal to zero or otherwise to plus or minus one, and therefore the following description is directed to the particular cases of N=0 and N=1 (the situation for N=−1 corresponding to that for N=1 although the magnetic flux converts in direction). First, it is assumed that each subloop has a same self-inductance L and that a main loop ML has a selfinductance as large as 2L when an associated switching element is open.

A fluxoid type superconducting logic element as shown in FIG. 1 is cryogenically cooled, and then it is exposed to an outer magnetic field to allow its main loop to catch an integral multiple of flux quantum units, which will be sustained by as much persistent electric current as required for sustaining the flux quantum units, flowing in the main loop of the element. Hence, the device of FIG. 1 is called a "main-loop persistent current biasing type" logic element.

Figure 2A:
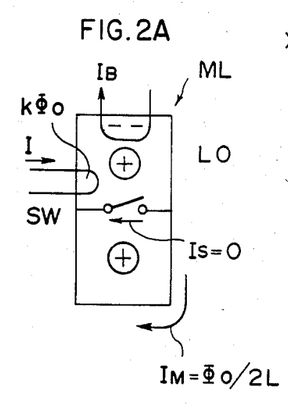
FIGS. 2A, 2B and 2C are schematics of another embodiment of the logic element of the present invention shown in different operating conditions.
Figure 2B:
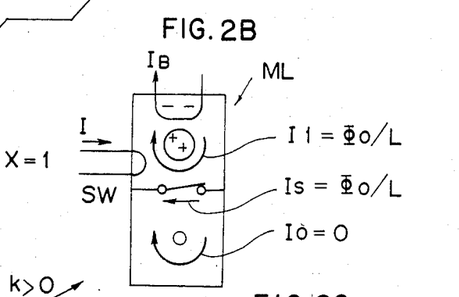
Figure 2C:
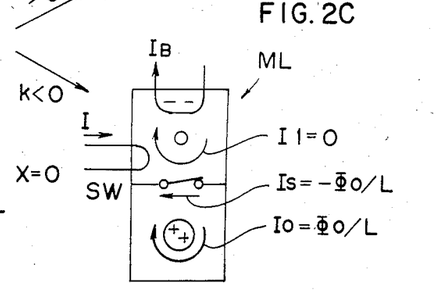
Figure 3A:
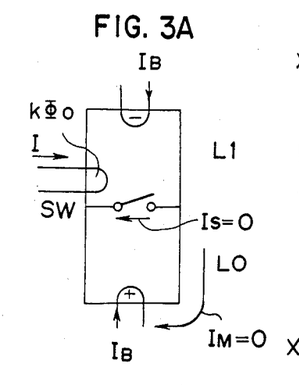
FIGS. 3A, 3B and 3C are schematics of still another embodiment shown in different operating conditions.
Figure 3B:
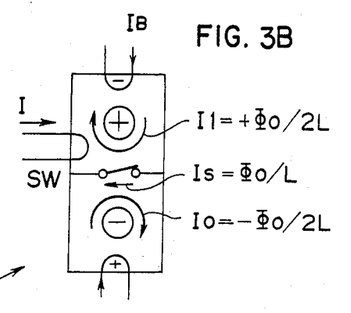
Figure 3C:
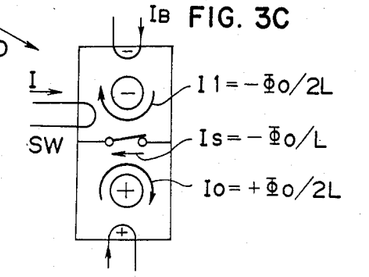
Figures 4A, 4B, 4C:
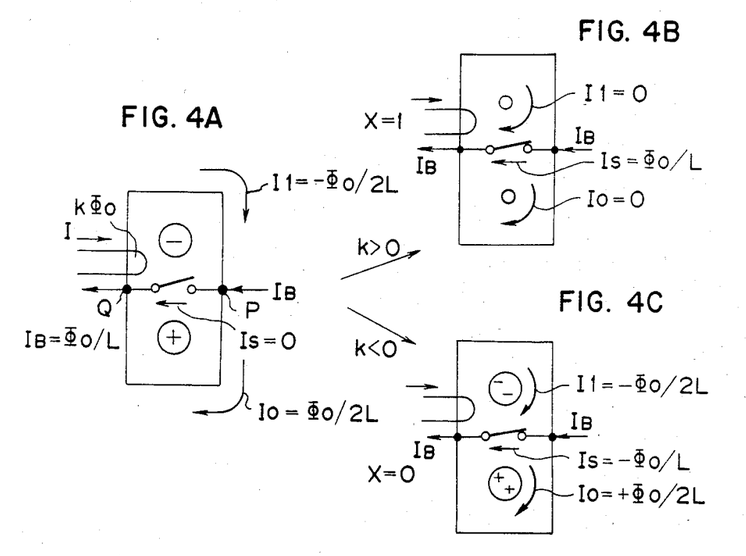
FIGS. 4A, 4B and 4C are schematics of still another embodiment shown in different operating conditions.

In contrast to this, logic elements as shown in FIGS. 2 and 3, are so constructed as to allow a bias current $I_B$ supplied from the exterior to intersect the main loop and generate a magnetic flux as required. In FIGS. 2, 3 and 4 (N=0) the encircled positive signs $\oplus$ and the encircled negative signs $\ominus$ indicate magnetic fluxes $+\phi_o/2$ and $-\phi_o/2$, respectively. Both in the open state in FIG. 2A and in the closed state in FIGS. 2B and C, the electric currents $I_M$, I1, I0 and $I_S$ flowing in the main loop, the subloops and the switching element respectively are the same in amplitude and in direction as in a main-loop persistent current biasing type logic element for N=1.

In FIG. 3 bias magnetic fluxes $-\phi_o/2$ and $+\phi_o/2$ are applied to the two subloops. The same electric current $I_S$ as in FIG. 2 flows through the switching element. In contrast to FIG. 2, however, in the open state (FIG. 3A) no electric current flows in the main loop ($I_M$=0), and in the closed state (FIGS. 3B and C) the same amount of electric current $\phi_o/2$ flows in each subloop in opposite directions. In this connection a logic element as shown in FIG. 3 is called hereinafter "Symmetric type" logic element because of the symmetric distribution of electric current in the two subloops of the element.

FIG. 4 shows a logic element which uses another way of symmetric biasing. The same electric current as in FIGS. 2 and 3 flows through the switching element when closed, but electric currents different in amplitude from those in FIGS. 2 and 3 flow in the subloops.

The electric currents $I_S$ I1 and I0 flowing in the switching elements and the subloops respectively are given in Table 1, using a three-phase variable X representing $\frac{1}{2}$ for the open state and 1 or 0 for the closed state respectively:

TABLE 1

$I1 = [b1 - (x - \frac{1}{2})]\phi_o/L,$
$I0 = [b0 - (x - \frac{1}{2})]\phi_o/L,$ and
$I_S = 2(x - \frac{1}{2})\phi_o/l$

|  | b1 | b0 |
|---|---|---|
| FIG. 1 | $\frac{1}{2}$ | $\frac{1}{2}$ |
| FIG. 3 | 0 | 0 |
| FIG. 4 | $-\frac{1}{2}$ | $\frac{1}{2}$ |

$b1\cdot\phi_o/L$ and $b0\cdot\phi_o/L$ represent bias currents flowing in the two halves of the main loop when the switching element is open. These bias currents vary with different embodiments given in FIGS. 2, 3 and 4, but as large an electric current as $2(x-\frac{1}{2})\phi_o/L$ flows through the switching element when closed in every embodiment. Different bias currents, however, flow to produce an integral multiple of flux quantum unit in the inner space of the main loop of each embodiment. These embodiments are quite similar in operation in that distribution of flux quantum units in each of the two areas into which the main loop space is separated by closing an associated switching element is controlled by a small amount of input magnetic flux $k\phi_o$, which is applied to one of the two halves of the main loop before the switching element is closed.

Figure 5:
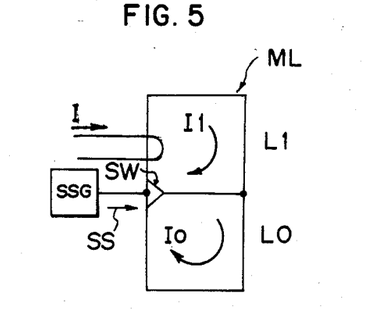
FIG. 5 shows a logic element of the present invention with an electronic type switch.

Only for the sake of convenience of describing the principle of the present invention is the switching element shown as a mechanical one in FIGS. 1 to 4. In practice, the switching element would be of the electronic type which performs a switching action in response to electromagnetic switching signals SS (see FIG. 5).

Figure 6A:
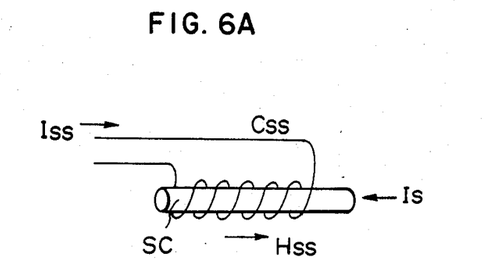
Figure 6B:
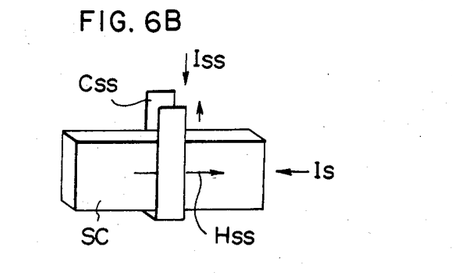

Actual examples of electronic type switching elements are given below. FIG. 6A shows the principle of a Crystron or parallel type switching element, and FIG. 6B shows the actual structure of the same. An electric current $I_S$ flows through a superconducting body SC. A control current $I_{SS}$ flows in a winding around the superconducting body SC. The magnetic field $H_{SS}$ is generated by the control current $I_{SS}$ flowing in the winding. When the strength of the magnetic field is raised above the critical magnetic field Hc of the superconducting body SC, it turns to the normal conducting state, thereby turning the electric current "off".

Figure 7:
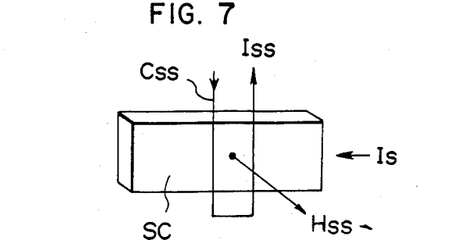

FIG. 7 shows the structure of a cross type switching element. In contrast to a Crystron type switching element in which the magnetic flux Hss and the electric current are parallel with each other, the magnetic flux Hss and the electric current $I_S$ cross with each other in direction. A cross type switching element made of a very thin superconducting film has a switching characteristic similar to a dc SQUID, which is described below.

Figure 8A:
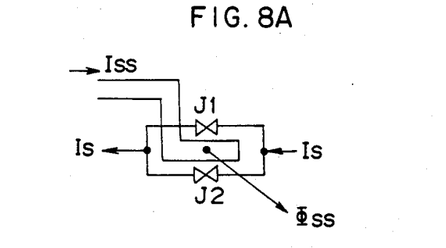
Figure 8B:
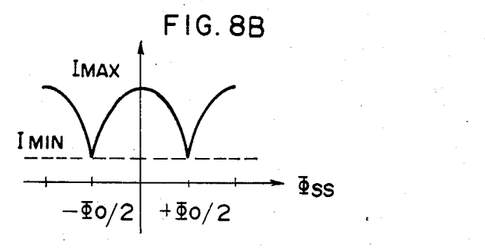
FIG. 8B illustrates the characteristics of the switch shown in FIG. 8A.

FIG. 8A shows a dc SQUID used as a switching element. It is shown as comprising a parallel connection of Josephson junctions J1 and J2 and a control winding for generating a magnetic flux $\phi_{ss}$ intersecting the loop defined by the parallel connection of the Josephson junctions. FIG. 8B shows a critical superconducting current Ic versus magnetic flux $\phi_{ss}$ characteristic. As seen from FIG. 8B, Ic reduces to the minimum $I_{MIN}$ at $\phi_{ss}=\pm\phi_o/2$, and IC increases to the maximum $I_{MAX}$ at $\phi_{ss}=0$. Thus, for instance, if $I_S$ is set equal to $I_{MAX}$, $I_S$ can flow through the parallel-connected Josephson junctions while no control current flows in the winding (and hence no magnetic flux appears). When a control current large enough to generate as strong a magnetic field as $\phi_o/2$ flows in the winding, $I_S$ cannot reduce to $I_{MIN}$ according to the quantum theory, and therefore the parallel-connected Josephson junction turns to the normal state or the "open" state.

Figure 8C:
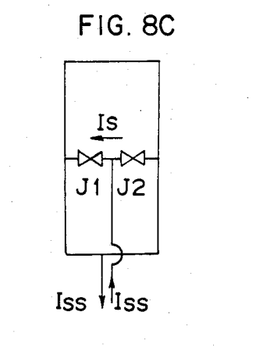

FIG. 8C shows a different configuration in which two Josephson junctions J1 and J2 are series-connected. A control current $I_{SS}$ flows into the intermediate joint of the series-connected Josephson junctions to separate and flow through each Josephson junction in opposite directions.

In the embodiments of FIGS. 2, 3 and 4 their switching elements will turn off for $|I_C| < \phi_o/L$, and will turn on for $|I_C| > \phi_o/L$.

Figure 9:
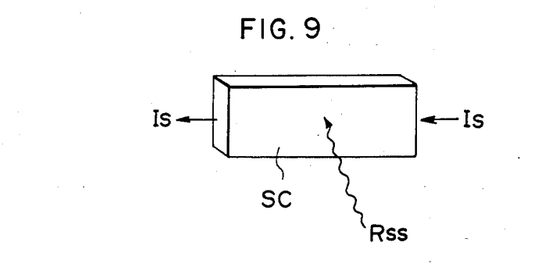

FIG. 9 shows an "electromagnetic wave" type switching element comprising essentially a superconductor film SC. This switching element is responsive to a control signal in the form of electromagnetic wave or light $R_{SS}$ for changing into critical superconducting current $I_C$ in amplitude.

A plurality of "bisectrons" can be connected with each other through the agency of superconductive selfinductances and/or mutual-inductances to constitute a threshold logic circuit. (What is meant by adding "superconductive" to "selfinductance" and "mutual-inductance" is that a concerned load or wire has no dc series resistance).

Figures 10, 11:
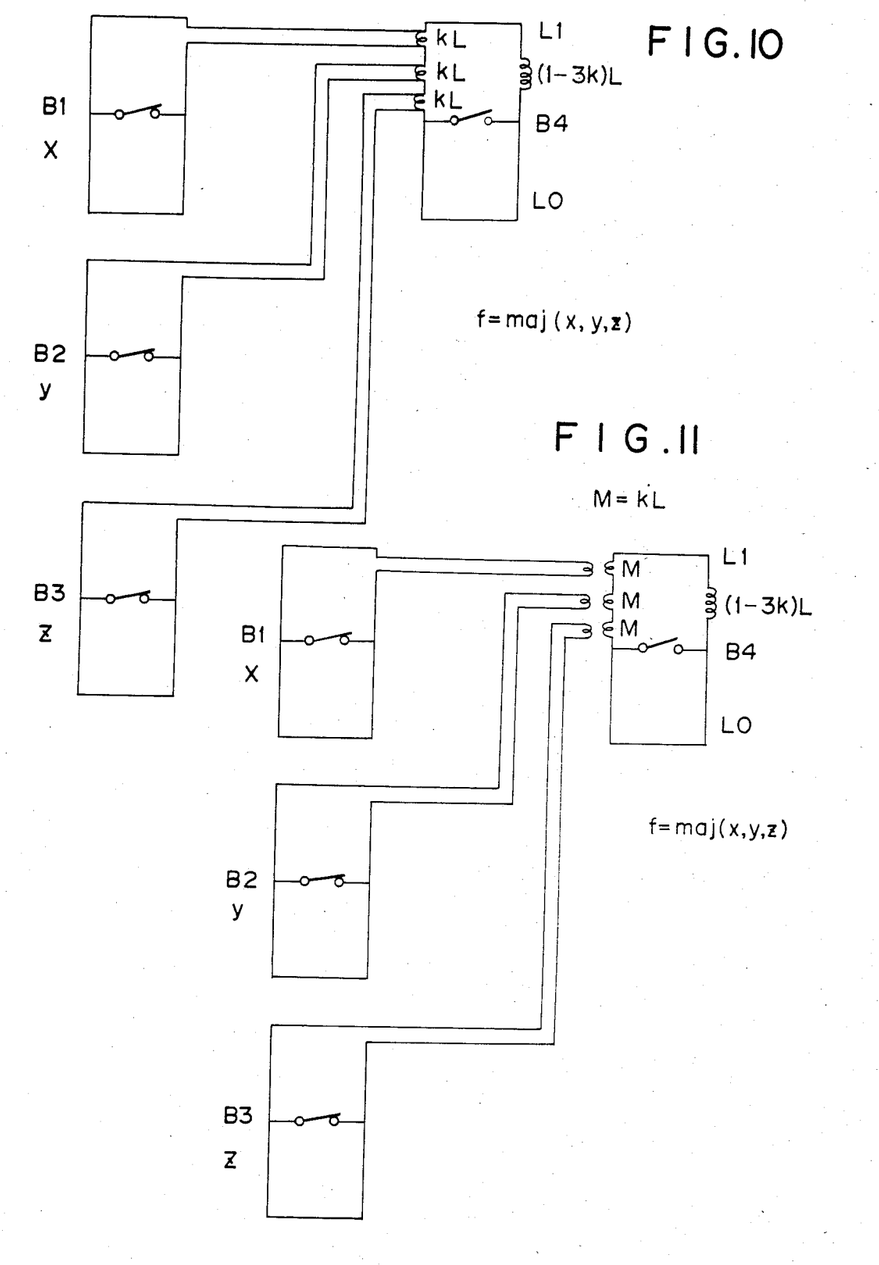
FIGS. 10, 11, 12 and 14 show different embodiments of logic networks embodying the logic elements of the present invention.

In FIG. 10 four "bisectrons" B1, B2, B3 and B4 each consisting of a symmetric type logic as shown in FIG. 3 are combined. The switches of B1, B2 and B3 are shown as being closed, and then B1, B2 and B3 represent logic values x, y and z respectively. B4 is connected with B1, B2 and B3 by three selfinductances KL. These three selfinductances KL and a single selfinductance (1−3K)L together constitute the total inductance of the subloop L1 of the "bisectron" B4. When the switching element of B4 turns "on", the logic value "f" represented by B4 is determined according to the majority logic function given by:

$$f = \text{maj}(x, y, z).$$

FIG. 11 shows a similar configuration using mutual inductances M in place of the selfinductances KL in FIG. 10, and therefore each "bisectron" is isolated from the remaining "bisectrons" in the sense that direct current does not flow from one to the other. This "direct current" isolation is effective to avoid the appearance of noise which otherwise, would be caused by electric current flowing into a common point.

Figures 12, 13, 14:
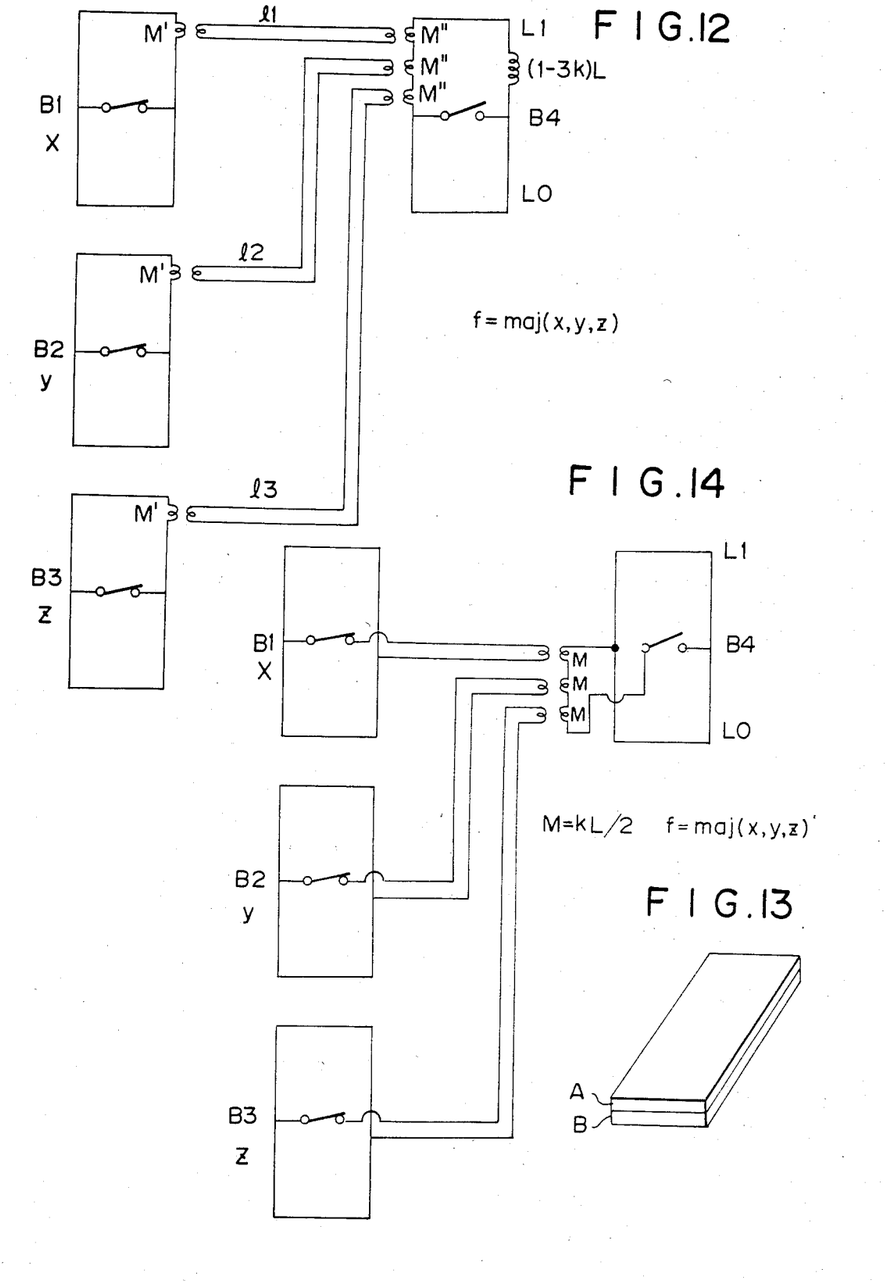
FIG. 13 is a perspective of a threshold logic circuit.

FIG. 12 shows another configuration using two different kinds of mutual inductance M' and M" to connect two "bisectrons" (M'·M"=KL²). If intermediate connecting loops l1, l2 and l3 are made of a superconductive material, the dc magnetic flux can be transmitted through the action of superconducting flux transformer, thus attaining the same function as in FIGS. 10 and 11.

In FIG. 12 the intermediate connecting loops l1, l2 and l3 are direct current isolated from all the "bisectrons". In making logic circuits in the form of superconductive coatings, the dc isolation of "bisectrons" from associated interconnecting loops advantageously permits two sheets A and B bearing a pattern of "bisectrons" and a pattern of interconnecting loops respectively to superpose on each other, thereby constituting a whole threshold logic circuit (see FIG. 13).

FIG. 14 shows still another configuration in which "bisectrons" B1, B2 and B3 are connected to a bisectron B4 by extending their switching bridges as far as the switching bridge of the bisectron B4.

In the majority logic circuits of FIGS. 10, 11 and 12, if the variable z is fixedly set at 0 or 1, an "and" or "or" circuit results:

"or" $(x,y) = \text{maj}(x,y,0)$, and

"or" $(x,y) = \text{maj}(x,y,1)$.

In either case the bisectron B3 functions to supply a given constant dc bias magnetic flux to the bisectron B4. Therefore, the bisectron B3 can be omitted, and then the dc bias flux to be applied to each subloop of the bisectron B4 is varied by as small an amount as $K\phi_o/2$.

As seen from Table 1, the current Is flowing through the switching element SW and the currents I1 and I0 flowing in the subloops L1 and L0 of a symmetric type logic element as, for instance, shown in FIG. 3 are equal to $\pm\phi_o/L$; $\pm\phi_o/2L$ and $\mp\phi_o/2L$, respectively. Making use of this symmetrical current distribution, a symmetric type logic element can represent the NOT of x (i.e. $\overline{X}$) simply by modifying the construction so as to invert the input current in polarity without recourse to an extra "not" circuit. For instance, if occasions demand, a majority logic as shown in FIGS. 10, 11, 12, or 14 can be modified so as to represent g=maj($\overline{X}$, Y, Z) simply by twisting the intervening connection between the "bisectrons" B1 and B4 as shown in FIG. 15. In the drawing the other "bisectrons" and associated interconnections are omitted for the sake of clarity. Specifically, FIGS. 15A, B, C and D show the manners in which the polarity of the input electric current representing X is inverted.

Figure 15A:
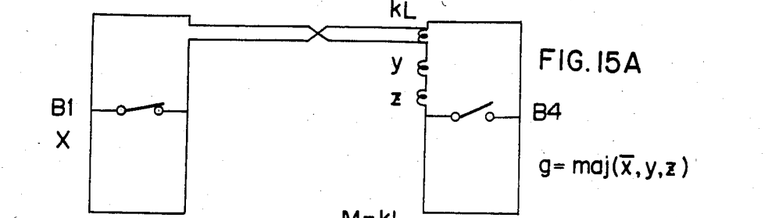
FIGS. 15A through 15D show networks of logic elements in which the polarities of the electric currents are inverted.
Figure 15B:
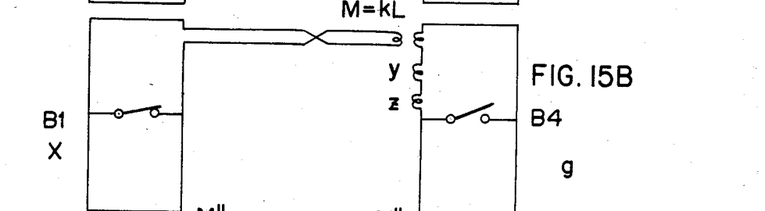
Figure 15C:
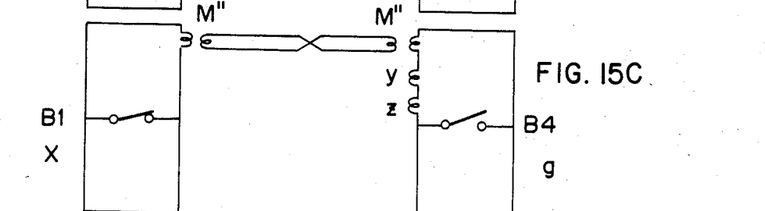
Figure 15D:
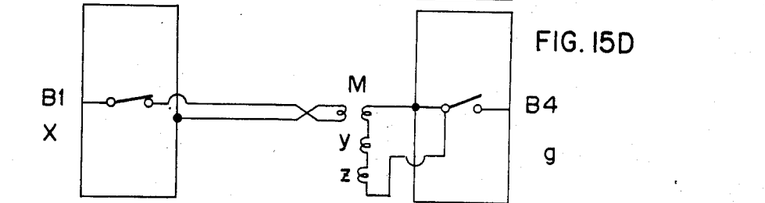
Figure 15E:
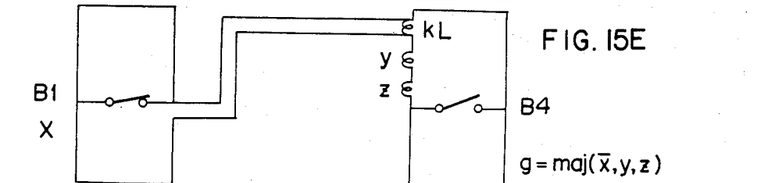
FIGS. 15E and 15F show networks of logic elements providing NOT circuits.
Figure 15F:
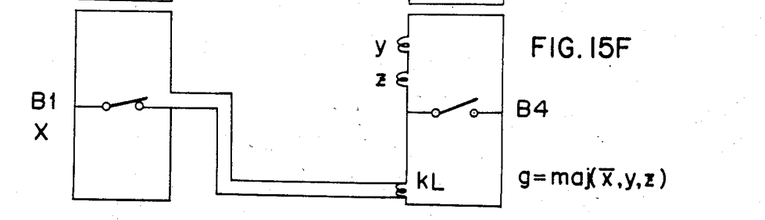

As seen from Table 1 or FIG. 3, the electric current flows in the subloops L1 and L0 of a symmetric type "bisectron" in opposite directions. Making use of this symmetrical current distribution, two different kinds of "not" circuit result as shown in FIGS. 15E and 15F. Specifically the current representing the NOT of X (or $\overline{X}$) flows in the subloop L1 of the "bisectron" B4 in FIG. 15E whereas the current representing the NOT of X (or $\overline{X}$) flows in the subloop L0 of the "bisectron" B4 in FIG. 15F.

In case that non-symmetric type logic elements as, for instance, shown in FIG. 2 are used to constitute threshold logic circuits of FIGS. 10, 11, 12, 14 and 15, it is important that the strength of bias magnetic flux in an intervening "bisectron" be determined in respect to both the amplitude of the electric current from preceeding "bisectrons" and the amplitude of electric current fed-back from following "bisectrons".

Figure 16:
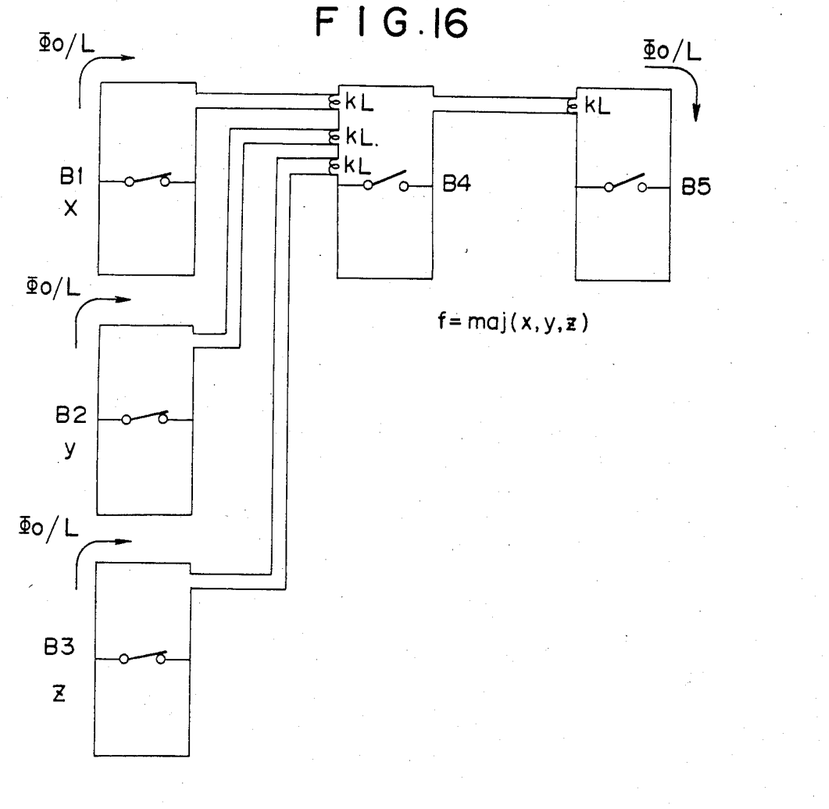
FIG. 16 shows a variation of the network system shown in FIG. 10.

FIG. 16 shows a threshold logic circuit using non-symmetrical "bisectrons" B1, B2, B3, B4 and B5 as shown in FIG. 2. The configuration of the threshold logic circuit excluding the "bisectron" B5 is the same as in FIG. 10. The intervening "bisectron" B4 is inductance-coupled to the following "bisectron" B5. The total current from the "bisectrons" B1, B2 and B3 is equal to $+3K\phi_o/L$ whereas the current fed-back from the "bisectron" B5 is equal to $-K\phi_o/L$. Thus, the resultant current $2K\phi_o/L$ must be taken into consideration in determining the bias magnetic flux producing current in the intervening "bisectron".

As is well known, an "n" variable threshold logic function "f" is given by:

$$w_1x_1 + w_2x_2 \ldots + w_nx_n - T > 0,$$

where $X_1, X_2 \ldots X_n$ each stands for a binary variable representing 0 or 1; $W_1, W_2 \ldots W_n$ each stands for a weight to be applied to a binary variable, and T is a given constant of positive or negative sign, called "threshold value".

For instance, a three variable logic function for $W_1=W_2=W_3=1$ and for $T=3/2$ represents a three-input majority function, maj $(X_1, X_2, X_3)$. A three-input majority function logic cirucit may be provided by connecting three "bisectrons" to a single "bisectron" by means of inductances appropriate for applying desired amounts of weight $W_1$, $W_2$ and $W_3$ to the input currents from the three "bisectrons" and by adjusting the strength of the bias magnetic flux to a given threshold value.

Figure 17A:
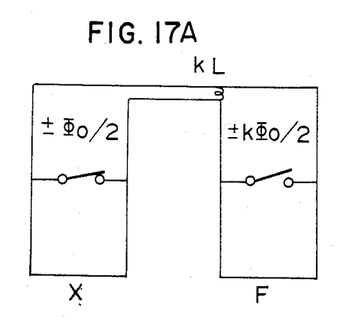
FIGS. 17A and 17B show inductively coupled logic elements in different operating conditions.
Figure 17B:
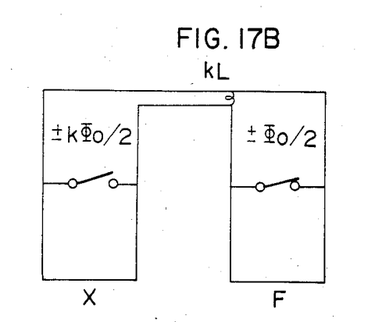

Inductance-coupled "bisectrons" constitutes a passive type coupling circuit, and therefore, a "bisectron" network has no directionality in transferring signals from input to output side or vice versa. FIG. 17 shows two "bisectrons" X and F coupled with an inductance KL. As shown in FIG. 17A the switching element of the "bisectron" X is closed, and then the increment of the flux quantum $\pm\phi_o/2$ in the "bisectron" X will appear as much as $\pm K\phi_o/2$ in the other "bisectron" F with its switching element open. Conversely, as shown in FIG. 17B, the increment of the flux quantum $\pm\phi_o/2$ in the "bisectron" F with its switching element closed will appear as much as $\pm K\phi_o/2$ in the other "bisectron" X with its switching element open.

Figure 18:
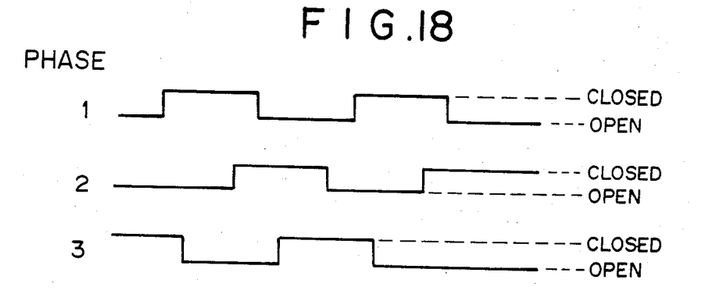
FIG. 18 shows control signals for application to the switching elements of different logic elements.

A train of "bisectrons", however, may allow a piece of information to travel only in one selected direction when their switching elements are controlled one after another. For instance, the train of "bisectrons" are sectioned to constitute a plurality of adjacent sets each including three "bisectrons", and then three phase-shifted control signals (FIG. 18) are applied to each set so that the switching elements of the three "bisectrons" in each set turn "on" one after another in the direction in which a piece of information is desired to travel. As a matter of course, the piece of information cannot travel in the direction opposite to the switching sequence of the series-connected "bisectrons". If four or more phase-shifted control signals are used, a train of "bisectrons" must be sectioned so that four or more "bisectrons" constitute one section or set.

Figure 19A:
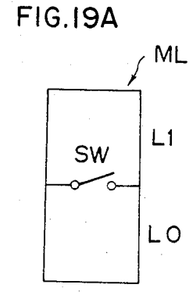
FIGS. 19A, 19B and 19C show there different configurations of logic elements.
Figure 19B:
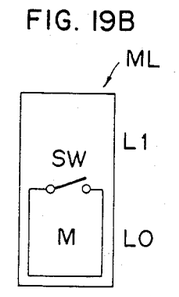
Figure 19C:
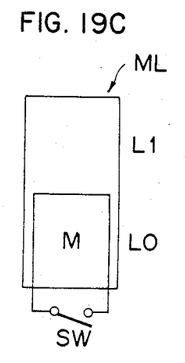

FIG. 19 shows three different configurations of "bisectron". FIG. 19A shows the same configuration as, for instance, FIG. 1 in which a switching element is connected directly across the main loop of a "bisectron" whereas FIGS. 19B and 19C show "bisectrons" each having a switching element coupled indirectly with the main loop by means of a mutual inductance M.

A plurality of "bisectrons" should be connected with each other so as to cause no adverse effect on adjacent "bisectrons" through associated dc bias current supplying connections at the transient switching time. Specifically, a pulse noise tends to appear in a dc bias current supplying connection in response to the variation in the flux distribution in the main loop of a "bisectron" at the transient switching time, thereby causing an adverse effect on adjacent "bisectrons". A "bisectron" in a logic network is preferably assured to be insensitive to such pulse noise.

Figure 20:
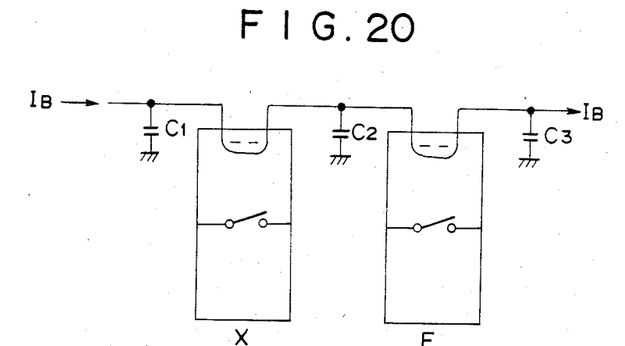
FIGS. 20, 21 and 22 show different ways of supplying bias current to a pair of logic elements.

FIG. 20 shows two "bisectrons" X and F with their bias current supplying connections series-connected with each other. The stray capacities $C_1$, $C_2$ and $C_3$ together with inductance couplings between the dc bias current supplying connections and the main loops of the "bisectrons" constitute charging-and-discharging circuits, thereby supplying undesired electric current to superpose the dc bias current, and hence adding or subtracting impredictable strength of flux to or from the main loop of the other "bisectron".

"Bisectrons" of the type as shown in FIG. 4 are insensitive to such disturbance thanks to the injection of the dc bias current to the joint between the switching element and the main loop of the "bisectron".

Figure 21:
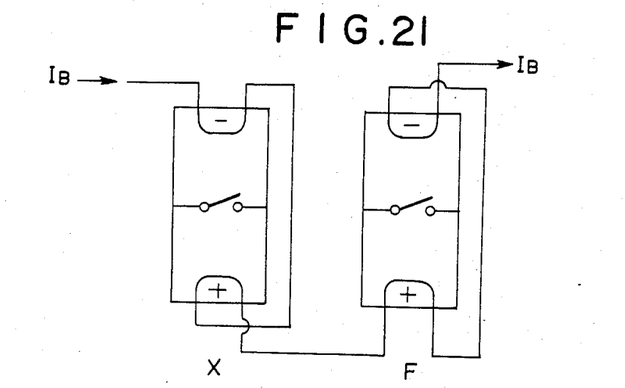
Figure 22:
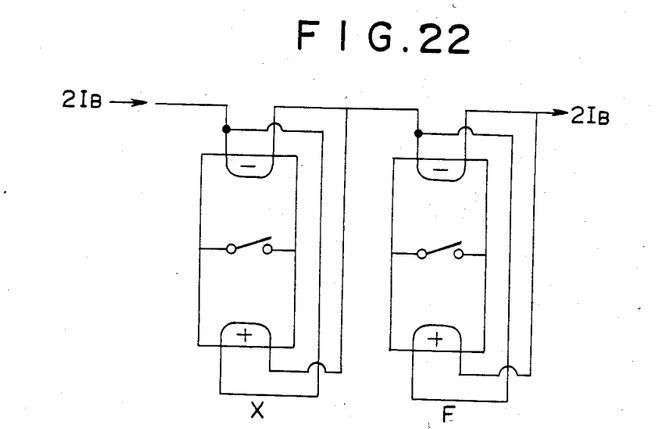

As regards a "bisectron" of FIG. 3, such "bisectrons" if connected with each other with their bias current supplying connections series-connected as shown in FIG. 21, will be sensitive to transient disturbances whereas such "bisectrons" if connected with each other with their bias current supplying connections parallel-connected in each "bisectron" and series-connected between adjacent "bisectrons" as shown in FIG. 22, will be insensitive to transient disturbances.

Figure 23:
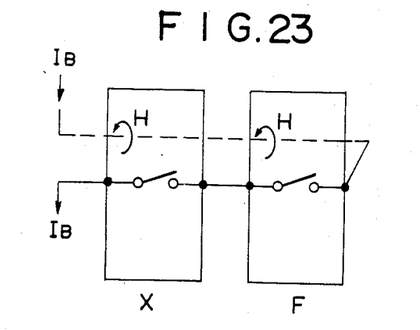
FIGS. 23 and 24 show different ways of interconnecting logic elements.
Figure 24:
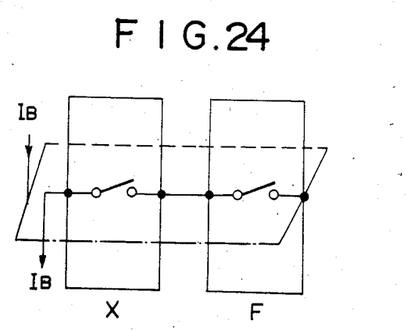

Another cause for disturbance is a dc stray magnetic field caused by dc bias current and linking a part of the main loop of a "bisectron". It is necessary that a round-trip dc bias current supplying connection is arranged so as for a stray magnetic field to cause no adverse effect on "bisectrons". In FIG. 23 two "bisectrons" of the type as shown in FIG. 2 are series-connected with a conductor (solid line) extending above the "bisectrons" X and F and the other conductor (broken line) of the round-trip bias current supplying connection extending below the "bisectrons" X and F. With this arrangement the stray magnetic field H tends to affect the magnetic field in the main loops of the "bisectrons" as indicated by arrows. In contrast, in FIG. 24 the "going" part of a round-trip bias current supplying connection devides into two extensions (broken and chain lines) at opposite sides of the series-connection of the "bisectrons" X and F and the "returning" part of the round-trip circuit extends in the same plane as the "bisectrons" lie. The stray magnetic field around the two "going" extensions tend to cancel the stray magnetic field around a single "returning" extension of the round-trip circuit, thus eliminating an adverse effect which otherwise, would be caused.

Figure 25:
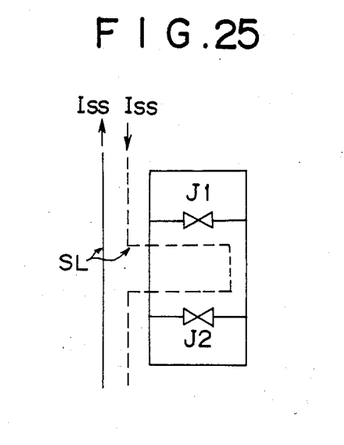
FIG. 25 shows a manner for supplying a control signal to a switching element.

A similar caution should be taken of switching control signal supplying connections. FIG. 25 shows a manner in which a switching control signal Iss is supplied to a dc SQUID type switch. The "going" and "returning" lines SL along which the switching signal Iss is suppling to the dc SQUID type switch, are put close to each other a possible longest distance therealong, thereby reducing an adverse effect caused by a stray magnetic field to a possible minimum.

As regards an energy required for operating "bisectrons" as shown in FIGS. 2, 3 and 4, the electric current Is flowing through the switching element is equal to $\pm\phi_o/L$, and the inductance of the circuit in which the electric current Is flows is equal to $L/2$. Therefore, the electromagnetic energy Eo in the "bisectron" with its switching element closed is equal to $Is^2L/4$ ($=\phi_o^2/4L$), and the closed "bisectron" is at as much higher a potential than the open "bisectron". This amount of energy is supplied in the form of switching control signal at a switching frequency f, thus requiring as much electric power as fEo.

Figure 26:
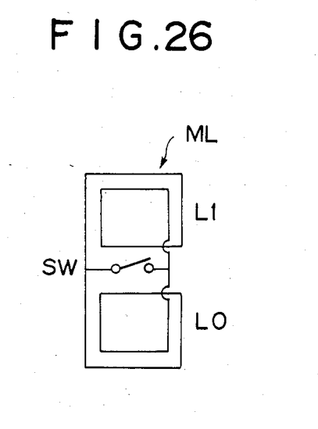
FIG. 26 shows a two-turn embodiment of logic element.

If a given volume of "bisectron" is reduced N times in respect of length, the required energy is increased N times. The amount of energy as required, however, can be reduced $N^2$ times by increasing the turns of each subloop N times without changing the cross-sectional area of the conductor. FIG. 26 shows a two-turn "bisectron" which requires energy four times as small as the energy which would be required in a single turn "bisectron".

Figure 27A:
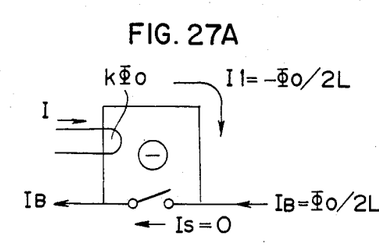
FIGS. 27A, 27B and 27C illustrate a "Quantron" in different operating conditions.
Figure 27B:
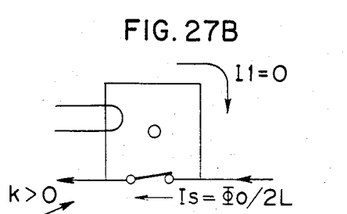
Figure 27C:
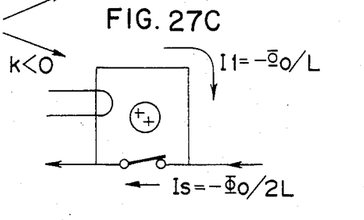
Figure 28A:
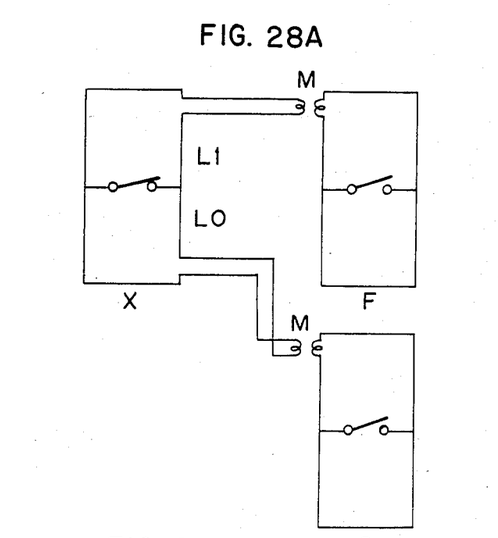
FIGS. 28A and 28B contrast networks of bisectrons and quantrons.
Figure 28B:
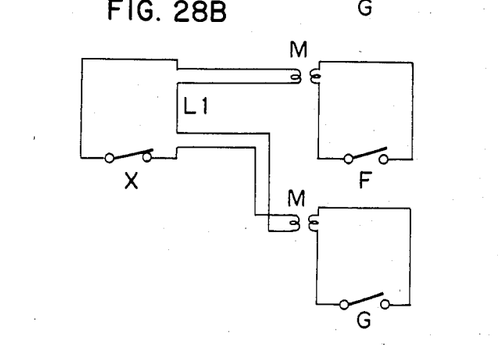

FIG. 27 shows the structure of a "Quantron", which is structurally equivalent to a "bisectron" with its lower half eliminated. These fluxoid type superconducting logic elements, "Quantrons" and "bisectrons" are different in operation as follows: First, a "Quantron" is responsive to an input magnetic flux of $K\phi_o$ for producing as much magnetic flux increment as $\pm\phi_o/2$ whereas a "bisectron" is reponsive to a same amount of input magnetic flux $(K\phi_o)$ for producing same amounts of magnetic flux increment $\pm\phi_o/2$ and $\pm\phi_o/2$ in the subloops L1 and L0 of the "bisectron", respectively, thus producing twice as large a total flux increment as the "Quantron". Second, a "bisectron" permits an output magnetic flux to appear in each of the two sub-loops of the "bisectron" when its switching element is closed. This dual effect is most advantageous as seen, for instance, from the following: FIG. 28 shows a dual-follower configuration consisting of one element ("bisectron" in FIG. 28A or "Quantron" in FIG. 28B) X and two associated elements ("bisectron" in FIG. 28A or "Quantron" in FIG. 28B) F and G coupled with the element X by mutual inductances M. The dc bias current supplying connections are omitted for the sake of clarity in the drawing.

Assume that the switching elements of logic elements X, F and G are controlled with the aid of multi-phase clock signal, specifically the logic element X being opened and closed according to the clock signal of Phase 1 whereas the logic elements F and G being opened and closed according to the clock signal of Phase 2. Also, assume that the logic element X is closed and that the logic elements F and G are about to turn "on". The logic elements F and G, however, cannot be controlled exactly at the same moment, indeed. For instance, suppose that the logic element F turns "on" somewhat earlier than the logic element G, and then any transition in the "bisectron" F tends to cause an adverse effect on the other "bisectron" G. This is, hereinafter, called "Equi-phase Noise". In the configuration using "bisectrons" (FIG. 28A) the two sub-loops of the "bisectron" are completely independent from each other, thus causing no "Equi-phase Noise" to appear in the later-closed "bisectron". Contrary to this, in the configuration using "Quantrons" (FIG. 28B) any transition appearing in the early closed "Quantron" F will cause an "Equi-phase Noise" to appear in the later closed "Quantron" G via the loop $L_1$ of the "Quantron" X.

The insensitivity of "bisectrons" to "Equi-phase Noise" is advantageous to increase of follower logic elements connected to a single original one. Assume that each of "N" follower "bisectrons" F1, F2 . . . Fn is inductance-coupled to one half of the main loop of an origial "bisectron" X and that each of "N" follower "bisectrons" G1, G2 . . . Gn is inductance-coupled to the other half of the main loop of the original "bisectron" X (the total of the logic elements: N (=2n). In the possible worst condition an "Equi-phase Noise" would come from each of (N−1) "bisectrons" belonging to each half of the main loop of the original "bisectron" X to reflect to the latest closed "bisectron" via two associated inductance couplings K, for instance, F2 $\overline{K}$ X $\overline{K}$ F1. Thus, the total amount of "Equi-phase Noise" is equal to $(N-1)K^2\phi_o$ for an input magnetic flux of $K\phi_o$. Then, the signal-to-noise ratio is equal to $K\phi_o/(n-1)K^2\phi_o$ $(=1/(n-1)K)$.

Now assume that each of "N" "Quantrons" Q1, Q2 . . . Q2n is inductance-coupled to an original "Quantron" X. Then, the signal-to-noise ratio is equal to $K\phi_o/(2n-1)K^2\phi_o$ $(=1/(2n-1)K)$.

The signal-to-noise ratios for two, four and six follower logic elements are given in:

TABLE 2

| N | 2 | 4 | 6 |
|---|---|---|---|
| n | 1 | 2 | 3 |
| "bisectron" | ∞ | 1/K | ½K |
| "Quantron" | 1/K | ⅓K | 1/5K |

A "Quantron" has a major defect. Specifically, its dc bias current supplying connection is sensitive to an exterior disturbance. The closure of the switching element of a "Quantron" causes the slip-out of magnetic flux $\pm\phi_o/2$ enough to leave the magnetic flux quantum in the loop L1 of the "Quantron" and then the slipped-out magnetic flux tends to extend as far as an infinite distance, thus after linking dc bias current supplying connections on the way to the infinite point, and then the stray magnetic flux tends to cause an adverse effect in the form of noise on associated "Quantrons".

Figure 29A:
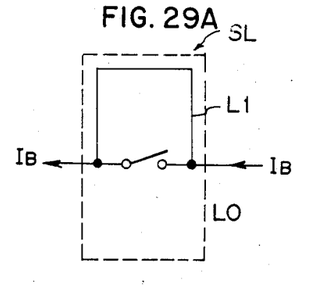
FIGS. 29A and 29B show, respectively a shielded bisectron and a shielded quantron.
Figure 29B:
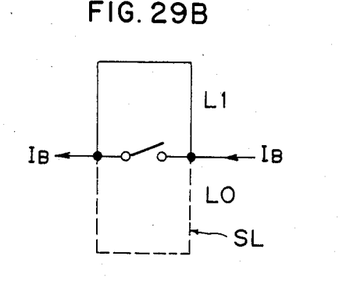

As a means to avoid this disturbance a superconducting shield loop SL is used to confine the magnetic flux within the enclosure, as shown in FIG. 29. Specifically, FIG. 29A shows two different modes of shielding that is, an independent type shielding loop (FIG. 29A) and a connecting-and-extending type shielding loop (FIG. 29B) which constitutes a complete shielding loop along with the "Quantron" loop L1. To make the dc bias current supplying connections completely insensitive to any exterior disturbance it is necessary to select the inductance of the shield loop just twice as large as the inductance L1 of the "Quantron" loop. This configuration, however, is equivalent to the structure of a "bisectron". Specifically, the shielded "Quantron" of FIG. 29A is equivalent to a "bisectron" of FIG. 19B whereas the shielded "Quantron" of FIG. 29B is equivalent to a "bisectron" of FIG. 4. Thus viewed, it might be justly said that the structure of a "bisectron" permits the effective use as its output of the magnetic flux $\pm\phi_o/2$ which, otherwise, would be allowed to extend to the infinite distance (accompanying, in fact, an adverse effect in the form of noise) in the structure of "Quantron".

It is important to reduce the noise due to the coupling between logic elements through stray mutual inductances when a lot of logic elements are integrated at a high density. From this point of view a "bisectron" is advantageous over a "Quantron"; the stray inductance coupling in the form of quadrpole interconnection reduces in proportion to $R^{-5}$ ("R" standing for distance between adjacent elements) in a "bisectron" whereas the stray inductance coupling in the form of dipole interconnection reduces in proportion to $R^{-3}$. The same tendency is found in undesired magnetic coupling causing an adverse effect on bias current supplying connections. Specifically, the dc bias magnetic flux tends to produce stray, dipole magnetic field (varying proportional with $R^{-3}$) in a "bisectron" of FIG. 1 or 2 and a "Quantron" whereas the dc bias magnetic flux tends to produce stray quadrple magnetic field (varying proportional with $R^{-4}$) in a "bisectron" of FIG. 3 or 4.

What is claimed is:

1. A fluxoid type superconducting logic element characterized in that it comprises:
   a base element including a single main superconductor loop ML and a switching element SW included in a superconductor extending across said main superconductor loop, thereby making it possible to magnetically separate said main superconductor loop into two subloops L1 and L0 when said switching element is closed;
   means for applying a switch control signal to said switching element, thereby switching from the open position in which the critical current remains at a value small enough to repel any magnetic flux quantum unit from said main superconductor loop to the closed position in which the critical current is at a value large enough to sustain more than one magnetic flux quantum unit in said main superconductor loop;
   means for applying a bias magnetic flux, the distribution of which tends to change in such a way that about a half of magnetic flux quantum unit $\phi_o$ may pass from one subloop to the other subloop when said switching element turns "off"; and
   means for applying a relatively small amount of input magnetic flux to superpose itself on said bias magnetic flux,
   whereby the distribution of an integer multiple (0, 1, −1) of magnetic flux quantum unit $\phi_o$ in said two subloops are varied by means of said input magnetic flux so as to represent a binary variable in terms of said distribution of an integer multiple of magnetic flux quantum unit.

2. A fluxoid type superconducting logic element according to claim 1 wherein said switching element is connected in circuit with a superconductor of boundary bridge physically separating said main loop into two halves corresponding to said subloops when said switching element is closed.

3. A fluxoid type superconducting logic element according to claim 1 including another similar logic element and a superconducting magnetic flux transformer coupling the logic elements.

4. A fluxoid type superconducting logic element according to claim 1 wherein said switching element comprises at least one Josephson junction.

5. A fluxoid type superconducting logic element according to claim 4 wherein said switching element comprises two parallel-connected Josephson junctions.

6. A fluxoid type superconducting logic element according to claim 5 wherein said switch control signal applying means is adapted to apply a controlled magnetic flux or electromagnetic wave to said Josephson junctions.

7. A fluxoid type superconducting logic element according to claim 1 wherein said bias magnetic flux applying means includes means for keeping said base element cold at a cryogenic temperature enough to allow the persistent electric current to flow in said main loop, thus providing said bias magnetic flux.

8. A fluxoid type superconducting logic element according to claim 1 wherein said bias magnetic flux applying means comprises a dc bias current supplying coil, which is electromagnetically coupled with one half of said main loop with a mutual-inductance.

9. A fluxoid type superconducting logic element according to claim 1 wherein said bias magnetic flux applying means comprises two coils coupled with two halves of said main loop corresponding to said subloops, said two coils being adapted to allow a dc bias current $I_B$ to flow therein.

10. A fluxoid type superconducting logic element according to claim 1 wherein said main loop is composed of a plurality of turns ("N" turns), thereby reducing the required energy to "$N^2$" times as much as the energy which would be required in a single turn of main loop.

11. A fluxoid type superconducting logic element according to claim 1 including another similar logic element and inductively coupled means through which one element supplies said input magnetic flux to another element.

12. A fluxoid type superconducting logic element as set forth in claim 11 wherein said inductively coupled means includes an inverted coupling providing a NOT circuit.

13. A fluxoid type superconducting logic element as set forth in claim 1 wherein said input magnetic flux applying means includes a superconductive inductance network for coupling with a plurality of other similar logic elements, said bias magnetic flux applying means of said logic element supplying the bias magnetic flux of the amount corresponding to a given threshold value against the logic state of said plurality of logic elements.

14. A fluxoid type superconducting logic element as set forth in claim 1 in combination with other similar logic elements, said logic elements being grouped in at least three sets and being adapted to turn "on" one after another in each set in response to application of at least three phase-shifted switching control signals to the switching elements of the logic elements of each set, thus permitting a logic signal to travel in one selected direction.

15. A fluxoid type superconducting logic element as set forth in claim 1 in combination with at least one additional similar logic element and including a common bias current supplying connection for eliminating noise which tends to appear at the time of the variation of magnetic flux in said subloops.

* * * * *